United States Patent [19]

Popp et al.

[11] 4,217,154
[45] Aug. 12, 1980

[54] METHOD FOR CONTROL OF AN OPEN GALLIUM DIFFUSION

[75] Inventors: Gerhard Popp, Lampertheim; Gerhard Held, Bürstadt, both of Fed. Rep. of Germany

[73] Assignee: BBC Brown, Boveri & Company, Limited, Baden, Switzerland

[21] Appl. No.: 955,713

[22] Filed: Oct. 30, 1978

[30] Foreign Application Priority Data

Nov. 16, 1977 [DE] Fed. Rep. of Germany ....... 2751163

[51] Int. Cl.$^2$ ............................................. H01L 7/34
[52] U.S. Cl. ..................................... 148/189; 148/175
[58] Field of Search ................................ 148/189, 175

[56] References Cited

U.S. PATENT DOCUMENTS

| 3,492,175 | 1/1970 | Conrad et al. | 148/175 |
| 3,689,330 | 9/1972 | Dosen et al. | 148/171 |
| 3,770,521 | 11/1973 | Demsky et al. | 148/189 |
| 3,806,382 | 4/1974 | Fitzgibbons et al. | 148/188 |

FOREIGN PATENT DOCUMENTS 46-35568 10/1971 Japan ....................................... 148/189

OTHER PUBLICATIONS

Tylan Corp. Brochure, "Gas-Systems for $H_2$–$O_2$...", R-6193-2 'A', Apr. 1972, pp. 1–7.
Lyndberg Co. (USA), "Burnt $H_2$-Oxidation Systems", Specification 87042, pp. 1–2.
Frosch et al., "Diffusion ... in Si ... ", J. Electrochem. Soc. 105 (1958) 695.

Primary Examiner—L. Dewayne Rutledge
Assistant Examiner—Upendra Roy
Attorney, Agent, or Firm—Oblon, Fisher, Spivak, McClelland & Maier

[57] ABSTRACT

A method for controlling a gallium diffusion with at least one silicon wafer, wherein precisely dosed amounts of hydrogen, oxygen, and optionally nitrogen are mixed in a combustion chamber where the hydrogen and oxygen is converted into water vapor and hydrogen. The combustion chamber is connected to a source portion of the diffusion oven, wherein is contained a gallium oxide containing crucible. The water vapor, hydrogen (and nitrogen) mixture is then passed from the combustion chamber to the source over where the volatile sub-oxide ($Ga_2O$), is produced and then carried in a gas stream to the silicon wafer contained in a main portion of the diffusion oven for diffusion therein.

3 Claims, 3 Drawing Figures

METHOD FOR CONTROL OF AN OPEN GALLIUM DIFFUSION

BACKGROUND OF THE INVENTION

1. Field of the Invention

This invention relates to a method for control of a gallium diffusion with at least one silicon wafer in the open tube of a diffusion oven, whereby a gas mixture of water vapor and mainly hydrogen is passed over gallium oxide ($Ga_2O_3$) and the volatile sub-oxide ($Ga_2O$) produced by reduction is then carried in the gas stream to the silicon wafers, optionally with additional control of the gallium concentration in the silicon by dilution of the gas mixture with nitrogen.

2. Description of the Prior Art

In a known such open gallium diffusion (Frosch, Derick: J. Electrochem. Soc. 105, p. 695, 1958) there is used for control of the gallium concentration in the silicon a water bath through which hydrogen, and optionally nitrogen, is passed in order to humidify the gas (Becker, Fischer, Popp: BMFT-Forsch-ungsbericht T 76-16, pp. 27-51, July 1976). The humidified gas is directed into a diffusion oven. The water bath is held at different temperatures according to the gallium concentration sought. For example, an increase in the boundary concentration is obtained by lowering the bath temperature. Additionally, the doping concentration can be adjusted by diluting the gas mixture with nitrogen.

If in the known case it is desired to vary the gallium concentration in the course of the diffusion as is always necessary when complicated diffusion profiles (double profiles) are to be produced, then, as already mentioned, the bath temperature must be varied. This can happen only with the time delay necessary for reaching a new temperature equilibrium. The known method is consequently subject to the following disadvantages:

(1) A slow adjustment of the concentration due to the thermal inertia of the water baths;

(2) The process cannot be made automatic;

(3) The baths must be attended, and a long-duration process, e.g. over the weekend, is not possible since the baths must be refilled at intervals of about 24 hours on account of evaporation;

(4) Baths through which the gases must be passed represent a source of contamination for the gases.

Impurities of the water bath reaching the diffusion tube with the water vapor can form recombination centers in the silicon and thereby reduce the carrier lifetime.

Thus, it is desirable to employ other techniques for producing the requisite mixture of water vapor and hydrogen for gallium diffusion.

Systems are known (company brochure of the Tylan Corporation "Gas Systems for $H_2$-$O_2$ Oxidations with HCR" R-6193-2 "A" of April 1972, pp. 1-7; company brochure of the Lindberg Co. (USA) "Burnt Hydrogen Oxidation Systems", Specification 87042, p. 112) in which hydrogen and oxygen are burnt in an oxidation oven. The water vapor is accordingly produced directly in the oxidation oven as the result of the chemical combustion reaction. In the known "Lindberg" case the application to diffusion processes is also mentioned. These known systems allow for the oxidation process a better control of the gas composition; less contamination of the gases; the possibility of automatic control through synchronized operation of the valves in the supply lines for hydrogen, oxygen and nitrogen, as well as easier manipulation, since no water baths must be attended. Thus far, however, it has found no application to gallium diffusion. Rather, it is operated with the stoichiometric mixture of 1:2 required for complete combustion of oxygen and hydrogen, or for safety reasons—even with an excess of oxygen so as to guarantee that under all circumstances no free hydrogen is left over after the reaction. Further, in the known case the nitrogen serves merely as a cleansing gas and is directed through the hydrogen nozzle. The oxygen line must, in the known case, be connected to the HCl line necessary there, in order to be able to carry out a final cleansing phase to prevent corrosion.

SUMMARY OF THE INVENTION

Accordingly, it is the object of this invention, proceeding from the above described method, to improve and simplify the process control and supervision and still maintain exact adherence to the desired doping material distribution.

This and other objects are achieved according to the invention by introducing the hydrogen in dry form and by humidifying the hydrogen necessary for control of the gallium concentration by the precisely dosed admixture of small amounts of oxygen and by partial combustion of the mixture before encountering the gallium oxide.

Preferably the gallium concentration $C_O$ is adjusted according to the following formula through control of the strengths of the gas flows [J in ml/min] forming the gas mixture;

$$C_o = K \left( \frac{J_{H2} - 2J_{O2}}{2J_{O2}} \right)^n \tag{1}$$

where K is a constant of $(0.5 \ldots 2.0) \times 10^{16}$ atoms/cm$^3$ and n is a constant between 1 and 2, when the source temperature is approximately 950° C. and the main oven temperature is approximately 1250° C.

To simplify control the oxygen proportion can preferably be varied with constant hydrogen content.

Through the invention the technical and industrial advantages of the above-described known method can be obtained without a water bath. The humidification of the hydrogen required for control of the concentration of the gallium is achieved, however, through exactly dosed admixtures, not held to a fixed proportion, of small quantities of oxygen and, thereafter preceding timewise and spatially, combustion of the mixture. The important factor is that through a rapid changeover from one gas mixture to another a fast and precise variation of the gallium concentration can be effected. Finally different temperatures are possible for the separate phases of the method, for the combustion, the reduction and the diffusion.

This and other objects are achieved according to the invention by undertaking the combustion of the gas mixture in a combustion chamber ahead of the gallium oxide.

Lead suitably into this combustion chamber are separate, direct oxygen, hydrogen and nitrogen connections or outputs with valves controllable from a central control device as well as with flow regulators.

BRIEF DESCRIPTION OF THE DRAWINGS

A more complete appreciation of the invention and many of the attendant advantages thereof will be readily obtained as the same becomes better understood by reference to the folllowing detailed description when considered in connection with the accompanying drawings, wherein.

DETAILED DESCRIPTION OF THE PREFERRED EMBODIMENTS

Figure 1:
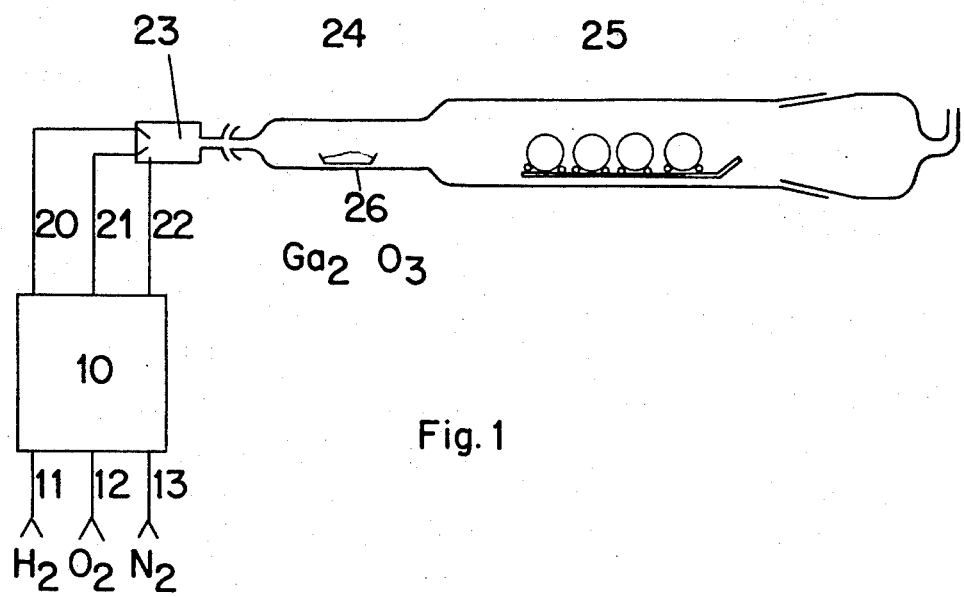
FIG. 1 is a schematic representation of an apparatus for carrying out the open gallium diffusion with a combustion chamber separated from the source oven.

Referring now to the drawings, wherein like reference numerals designate identical or corresponding parts throughout the several views, and more particularly to FIG. 1 thereof, the apparatus for carrying out the open gallium diffusion comprises a central control device 10, a gas line 11 for hydrogen, gas line 12 for oxygen, and a gas line 13 for nitrogen. In the control device are magnet valves as well as gas flow measuring and regulating devices, which can influence the gas flows in the lines 11, 12 and 13 according to an adjustable time schedule. The lines 11, 12 and 13 lead further to separate connections 20, 21 and 22 to a combustion chamber 23. There must prevail in the combustion chamber 23 upon introduction of the hydrogen, for reasons of safety, a temperature of at least 500° C., so that a continuous combustion of hydrogen-oxygen mixtures is assured. Adjoining this combustion chamber is a source oven 24 followed by a main oven 25, the source oven 24 having a somewhat smaller or the same sized diameter as that of the main oven 25. In the source oven 24 is the gallium oxide 26, in the main oven 25, the silicon wafer 27 to be diffused.

The process of the invention proceeds as is now described.

Firstly, for the open gallium diffusion only dry gases ($O_2$, $H_2$, $N_2$) are used. The humidification of the hydrogen required for control of the gallium concentration is achieved by the precisely dosed admixture of small quantities of oxygen and by the combustion of the mixture.

In the gallium diffusion process, it is a matter of a diffusion in an open tube, i.e. an evacuation is not required. Provided for this purpose is the diffusion oven consisting of the source oven 24 at a temperature of e.g. 950° C. and the main oven 25 at e.g. 1250° C. For doping one uses $Ga_2O_3$ which at the temperature of the source oven 24 is hardly volatile. By reduction with hydrogen according to the equation $$Ga_2O_3 + 2H_2 \rightarrow Ga_2O + 2H_2O \tag{2}$$

it can be converted to a volatile sub-oxide $Ga_2O$, which is carried along with the hydrogen flow until it encounters the silicon wafers. On the basis of the law of mass action, the reation equilibrium can be controlled through the humidification of the hydrogen produced in the manner described above. The vapor pressure p of the gallium sub-oxide is in thermal equilibrium.

$$P(Ga_2O) = K \left( \frac{P_{H2}}{P_{H2O}} \right)^2 \tag{3}$$

where K is constant and each P is the vapor pressure of the substance denoted by the associated subscript.

Knowing these relations, it is possible by a superposition method to generate complicated double profiles according to certain given specifications of the profiles, e.g. diffusion depth and gradient. Such data are given in the cited research report.

Figure 2:
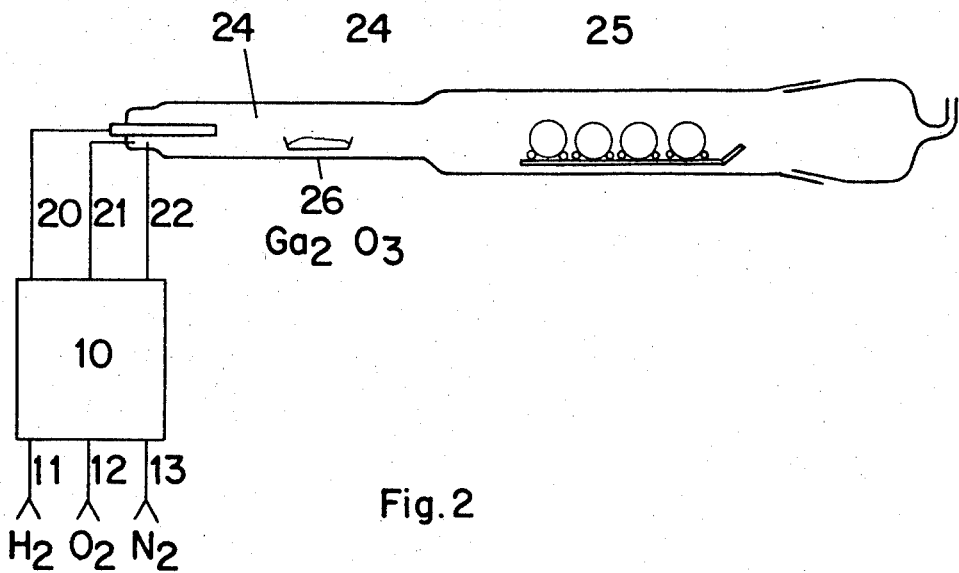
FIG. 2 is a schematic representation of an apparatus as shown in FIG. 1, but with a combustion chamber integrated with the source oven; and, FIG. 3 is a graph showing the relation between the gallium concentration and the oxygen flow rate with constant hydrogen flow rate.
Figure 3:
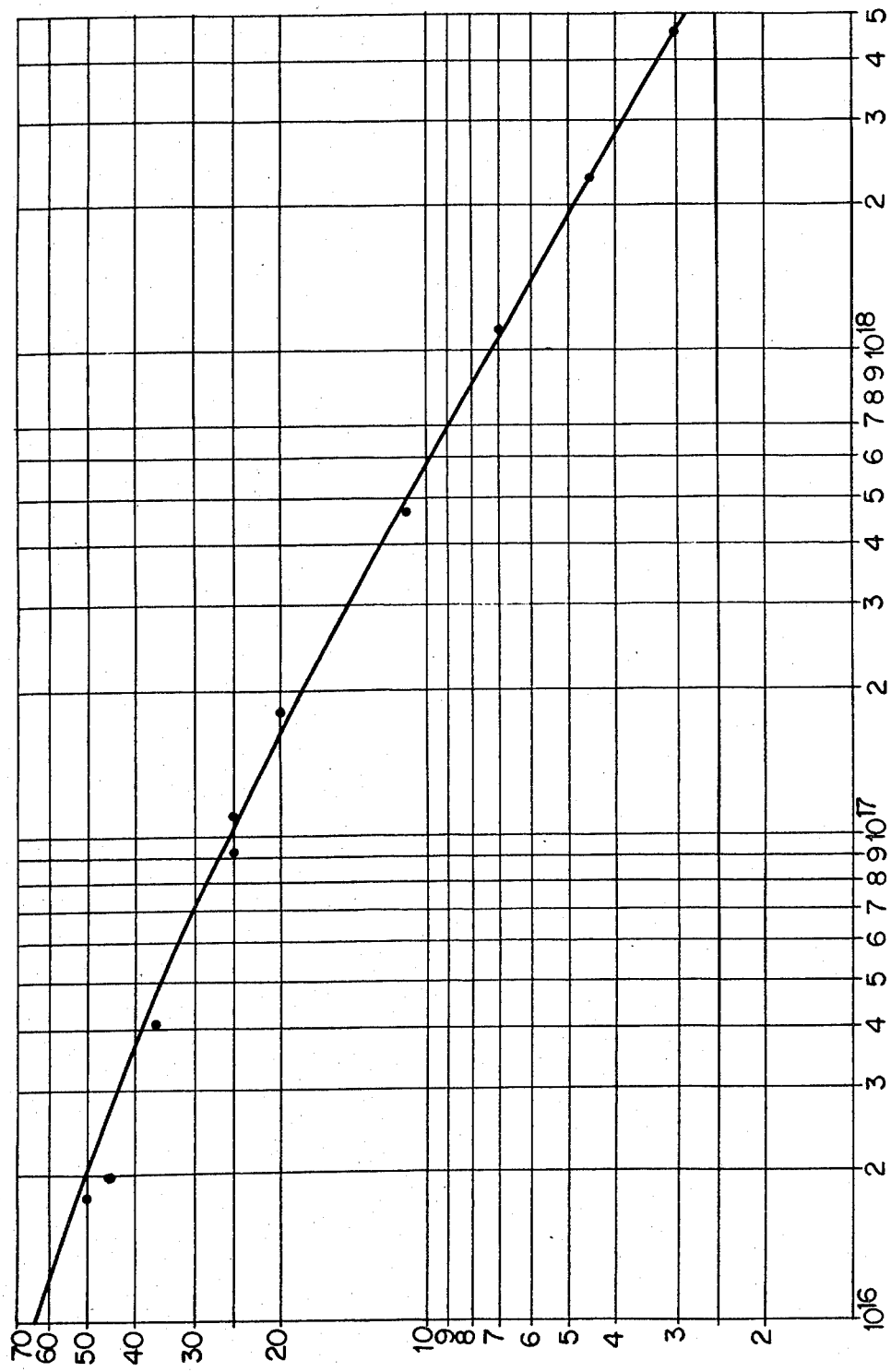

The arrangements of FIGS. 1 and 2 satisfy the requirements for an easily controlled gallium diffusion in an open tube. In FIG. 3 the gallium concentration Co in atoms per $cm^3$ is given as the abscissa and the oxygen ($O_2$) flow rate in milliliters (ml) per minute as the ordinate. The parameter is the hydrogen ($H_2$) flow rate=250 milliliters (ml) per minute. The points in FIG. 3 show how, e.g. by variation of the oxygen content at constant hydrogen content, the gallium concentration Co at the surface of the silicon wafer can be varied. In furtherance of the ideas of Wagner and Povilonis the concentration Co is defined by the above described relationship (1).

In the cited example, with the source oven 24 at 950° C. and the main oven 25 at 1240° C. and a hydrogen flow of about 250 ml/min, the curve drawn in FIG. 3 corresponds to a choice of the constants $K = 1.033 \times 10^{16}$ $cm^{-3}$ and $n = 1.64$.

It is seen that the measured points follow the formula quite well. By mixing nitrogen into the hydrogen-oxygen mixture the concentration Co can be reduced in comparison with the values of FIG. 3 (dilution of the carrier gases).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a method of controlling a gallium diffusion with at least one silicon wafer in an open tube of a diffusion oven including a source oven and a main oven, wherein a gas mixture of water vapor and mainly hydrogen is passed over gallium trioxide ($Ga_2O_3$) and the volatile sub-oxide ($Ga_2O$) produced by reduction is then carried in a gas stream to the silicon wafer, with additional control of the gallium concentration in the silicon by dilution of the gas mixture with nitrogen, the improvement comprising:

introducing dry hydrogen into said open tube;

mixing precisely dosed additions of relatively small quantities of dry oxygen with said dry hydrogen in said open tube; and combusting the resulting mixture of said dry hydrogen and said dry oxygen prior to said mixture encountering said gallium trioxide;

whereby the admixture of water vapor required for controlling the gallium concentration is obtained through combustion of the additions of small quantities of said dry oxygen before encountering said gallium trioxide.

2. A method according to claim 1, further comprising:

regulating gallium concentration Co in accordance with the following formula through control of the strengths (J) of the gas flows (ml/min) forming the gas mixture.

$$Co = K \left( \frac{J_{H_2} - J_{O_2}}{2 J_{O_2}} \right)^n$$

where K is a constant of $(0.5-2.0) \times 10^{16}$ atoms/cm$^3$ and n is a constant between 1 and 2, when temperature in the source oven is approximately 950° C. and the temperature of the main oven is approximately 1250° C.

3. A method according to claims 1 and 2, further comprising:
varying said precisely dosed additions of dry oxygen while maintaining constant hydrogen content.

* * * * *